US010454473B2

United States Patent
Lu et al.

(10) Patent No.: US 10,454,473 B2
(45) Date of Patent: Oct. 22, 2019

(54) OPTICAL-CONTROL DRIVING CIRCUIT FOR HIGH UTILITY POWER

(71) Applicant: VOLTRONIC POWER TECHNOLOGY CORP., Taipei (TW)

(72) Inventors: Yu-Cheng Lu, Taipei (TW); Tao Liu, Guangdong (CN); Feng Luo, Shenzhen (CN); Juor-Ming Hsieh, Taipei (TW)

(73) Assignee: VOLTRONIC POWER TECHNOLOGY CORP., Taipei (TW)

( * ) Notice: Subject to any disclaimer, the term of this patent is extended or adjusted under 35 U.S.C. 154(b) by 0 days.

(21) Appl. No.: 16/044,850

(22) Filed: Jul. 25, 2018

(65) Prior Publication Data

US 2019/0288684 A1    Sep. 19, 2019

(30) Foreign Application Priority Data

Mar. 14, 2018  (CN) .......................... 2018 1 0209732

(51) Int. Cl.
*H03K 17/79* (2006.01)
*H03K 17/795* (2006.01)

(52) U.S. Cl.
CPC ......... *H03K 17/79* (2013.01); *H03K 17/7955* (2013.01)

(58) Field of Classification Search
CPC ........ G05D 22/00; G05D 22/02; H03K 17/00; H03K 17/04123; H03K 17/567; H03K 17/72; H03K 17/725; H03K 17/79; H03K 17/7955

USPC .......................................................... 327/428
See application file for complete search history.

(56) References Cited

U.S. PATENT DOCUMENTS

| 9,564,891 | B1* | 2/2017 | Bixby | H03K 17/72 |
| 2012/0153995 | A1* | 6/2012 | Oughton, Jr. | H03K 17/00 327/109 |
| 2014/0239205 | A1* | 8/2014 | Holtz | H03K 17/605 250/551 |
| 2019/0044428 | A1* | 2/2019 | Okumura | H02S 40/32 |

* cited by examiner

*Primary Examiner* — Lincoln D Donovan
*Assistant Examiner* — Dave Mattison
(74) *Attorney, Agent, or Firm* — Li & Cai Intellectual Property (USA) Office

(57) ABSTRACT

An optical-controlled driving circuit adapts to a high utility power environment with high voltages, large currents and severe surges, and includes an optical-controlled switch circuit, an SCR with optical-controlled driver and a main circuit. The optical-controlled switch circuit includes an optical-controlled component and a first switching transistor that are connected in serial. The SCR with optical-controlled driver includes at least two switching transistors that are connected in serial and a plurality of diodes, and is coupled to the main circuit. The optical-controlled driving circuit generates a driving current according to the voltage of a utility power. When the optical-controlled driving circuit is used in a DC converter using an SCR as a switch element, the optical-controlled driving circuit helps to increase the operation efficiency when the DC converter works under a light load.

7 Claims, 4 Drawing Sheets

OPTICAL-CONTROL DRIVING CIRCUIT FOR HIGH UTILITY POWER

BACKGROUND OF THE INVENTION

1. Field of the Invention

The present disclosure relates to an optical-controlled driving circuit for high utility power; in particular, to an optical-controlled driving circuit that adapts to environments with high utility power where high voltages, large currents and severe surges are concerned.

2. Description of Related Art

Usually, an SCR (Silicon-Controlled Rectifier; SCR) can be used as a switch to control utility power. However, while the reference point of a control signal from a system terminal is common-grounded, the reference point of the thyristors of the SCR is not. Therefore, an SCR driving circuit needs to be isolated, and this is often implemented by transformer isolation or optical-controlled isolation. The transformer isolation may have high driving loss and poor pulse driving performance. Particularly, the pulse driving makes the resistance between the cathode and the anode of the SCR varies like a pulse wave. In this case, under a working condition with a large utility current, the SCR will be damaged due to its resistance variation, which decreases the operation efficiency of the SCR driving circuit.

Considering the high operation efficiency required of SCR driving circuits, the optical-controlled isolation becomes another option. However, the maximum voltage drop of a thyristor is usually 800V due to restrictions of power density and packaging of power source elements, thus limiting the high-voltage tolerance and the reaction to severe surges of a thyristor. Accordingly, there is a need in the art for a new SCR driving circuit that can adjust its driving current according to the voltage of a utility power and that can adapt to environments with high utility power where high voltages, large currents and severe surges are concerned.

SUMMARY OF THE INVENTION

To solve the above problems (e.g., high driving loss cause due to the transformer isolation, or damage to the SCR due to discontinuous driving currents), the present disclosure provides an optical-controlled driving circuit that adapts to a high utility power environment with high voltages, large currents and severe surges, and has advantages such as a high operation efficiency and a quick and dynamic response.

The optical-controlled driving circuit in the present disclosure can work under a high utility power environment with high voltages, large currents and surges, and includes an optical-controlled switch circuit, a SCR with optical-controlled driver and a main circuit. The optical-controlled switch circuit includes an optical-controlled component and a first switching transistor, and receives a switch signal. The optical-controlled component and the first switching transistor are connected in serial, and the optical-controlled component has at least four terminals. The SCR with optical-controlled driver receives a utility power, and is coupled to the optical-controlled switch circuit. The SCR with optical-controlled driver includes a second switching element, a third switching element, a first diode, a second diode, a third diode and a fourth diode. A cathode of the third switching element is coupled to an anode of the second switching element, and receives the utility power. A cathode of the first diode is coupled to a gate of the second switching element, and an anode of the first diode is coupled to a third terminal of the optical-controlled component. A cathode of the second diode is coupled to a gate of the third switching element, and an anode of the second diode is coupled to the anode of the first diode. A cathode of the third diode is coupled to the anode of the second switching element, and an anode of the third diode is coupled to a fourth terminal of the optical-controlled component. A cathode of the fourth diode is coupled to an anode of the third switching element, and an anode of the fourth diode is coupled to the anode of the third diode. The main circuit is coupled to the SCR with optical-controlled driver, and has an A terminal, a B terminal and a ground terminal. The A terminal of the main circuit is coupled to the cathode of the second switching element, and the B terminal is coupled to the anode of the third switching element.

For further understanding of the present disclosure, reference is made to the following detailed description illustrating the embodiments of the present disclosure. The description is only for illustrating the present disclosure, not for limiting the scope of the claim.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION OF EXEMPLARY EMBODIMENTS

The aforementioned illustrations and following detailed descriptions are exemplary for the purpose of further explaining the scope of the present disclosure. Other objectives and advantages related to the present disclosure will be illustrated in the subsequent descriptions and appended drawings. In these drawings, like references indicate similar elements.

In the following descriptions, terms refers to switches include switch elements, but in practice the switch elements are not restricted by IGBT, BJT, MOS, CMOS, JFET or MOSFET. Also, terms, including "first", "second", "third", "first switch transistor", "fourth switching transistor", "first capacitor", "second capacitor", "first diode", "second diode" . . . , are for distinguishing one element from another element without a specific sequence. Therefore, in one embodiment, there may be a first switching transistor and a fourth switching transistor but no second switching transistor.

Terms "first end" and "second end", "upper end" or "lower end", "right end" and "left end", "primary end" and "secondary end" or the like are for distinguishing one end from another end, one end of an element from another end of the same element, or one element from another element, but not indicate any sequence or element positions. Also, terms "and/or" include any and all combinations of one or more of the associated listed items.

To improve the disadvantages of a conventional SCR (Silicon-Controlled Rectifier; SCR) driving circuit (e.g., high driving loss due to transformer isolation, or damage to the SCR due to discontinuous driving currents), the present disclosure provides an optical-controlled driving circuit that adapts to a high utility power environment with high voltages, large currents and severe surges, and has advantages such as a high operation efficiency and a quick and dynamic response.

Figure 1:
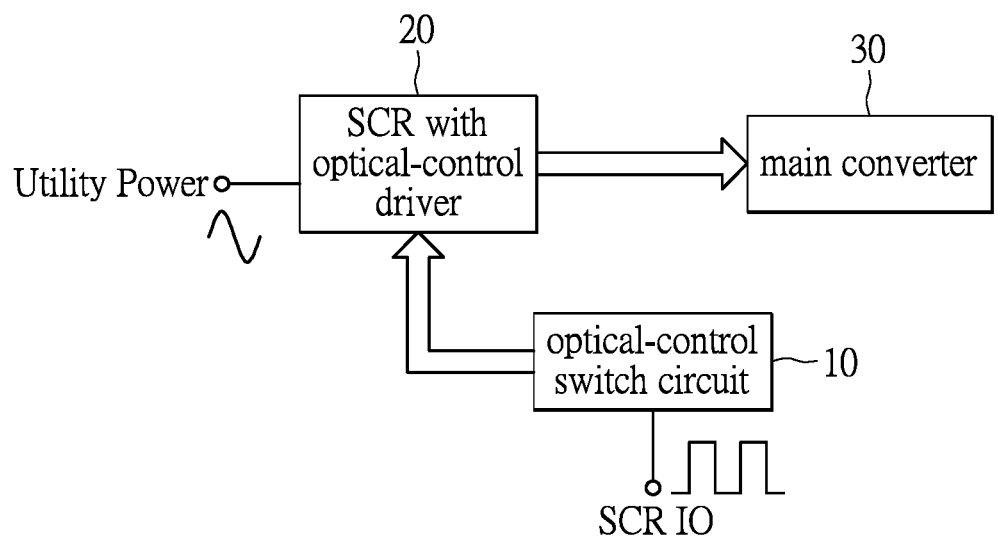
FIG. 1 shows a block diagram of an SCR with an optical-controlled driving circuit according to one embodiment of the present disclosure.

The optical-controlled driving circuit shown in FIG. 1 includes an optical-controlled switch circuit 10, an SCR with optical-controlled driver 20 and a main circuit 30. The main circuit 30 can be a converter. The optical-controlled switch circuit 10 receives a switch signal SCRIO, and the turning on and off of the optical-controlled switch circuit 10 is controlled by the switch signal SCRIO. The SCR with optical-controlled driver 20 receives a utility power, is coupled to the optical-controlled switch circuit 10, and works according to the on and off of the optical-controlled switch circuit 10. The main circuit 30 is coupled to the SCR with optical-controlled driver 20, and the SCR with optical-controlled driver 20 controls the main circuit 30.

Figure 2:
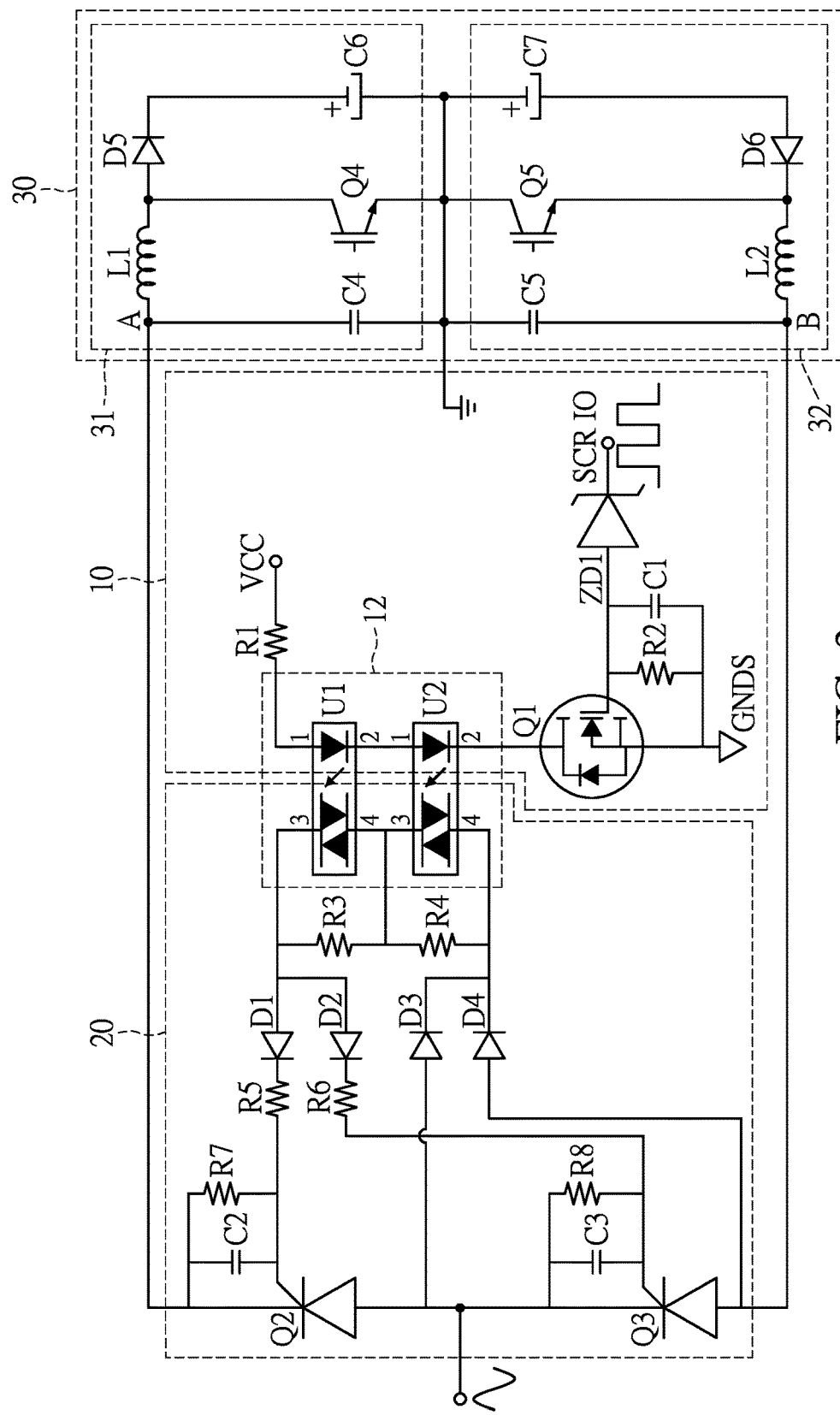
FIG. 2 shows a circuit diagram of an SCR with an optical-controlled driving circuit according to one embodiment of the present disclosure.

As shown in FIG. 2, the optical-controlled switch circuit 10 includes an optical-controlled component 12 and a first switching transistor Q1. The optical-controlled component 12 and the first switching transistor Q1 are connected in serial. The optical-controlled component 12 at least has four terminals and includes at least two optical-controlled thyristors, such as the first optical-controlled thyristor U1 and the second optical-controlled thyristor U2 which are connected in serial. The first terminal of the optical-controlled component 12 receives a direct power VCC. The drain of the first switching transistor Q1 is coupled to the second terminal of the optical-controlled component 12, the source of the first switching transistor Q1 is grounded, and the gate of the first switching transistor Q1 receives the switch signal SCRIO.

It should be noted that, both of the first optical-controlled thyristor U1 and the second optical-controlled thyristor U2 have four ends. As shown in FIG. 2, the first end of the first optical-controlled thyristor U1 is the first terminal of the optical-controlled component 12. The second end of the second optical-controlled thyristor U2 is the second terminal of the optical-controlled component 12. The third end of the first optical-controlled thyristor U1 is the third terminal of the optical-controlled component 12. The fourth end of the optical-controlled thyristor U2 is the fourth terminal of the optical-controlled component 12. The first end of the first optical-controlled thyristor U1 receives the direct power VCC, and the third end of the first optical-controlled thyristor U1 is coupled to the SCR with optical-controlled driver 20. The first end of the second optical-controlled thyristor U2 is coupled to the second end of the first optical-controlled thyristor U1, and the second end of the second optical-controlled thyristor U2 is coupled to the drain of the first switching transistor Q1. The third end of the second optical-controlled thyristor U2 is coupled to the fourth end of the first optical-controlled thyristor U1, and the fourth end of the second optical-controlled thyristor U2 is coupled to the SCR with optical-controlled driver 20.

In one embodiment, the optical-controlled switch circuit 10 further includes a voltage regulating element ZD1, a first capacitor C1, a first resistor R1 and a second resistor R2. The cathode of the voltage regulating element ZD1 receives the switch signal SCRIO, and the anode of the voltage regulating element ZD1 is coupled to the gate of the first switching transistor Q1. The first capacitor C1 and the second resistor R2 are connected in parallel. The first end of the first capacitor C1 (the upper end of the first capacitor C1 in FIG. 2) is also coupled to the gate of the first switching transistor Q1, and the second end of the first capacitor C1 (the lower end of the first capacitor C1 in FIG. 2) is coupled to the source of the first switching transistor Q1. Due to the connection relationships among the voltage regulating element ZD1, the first capacitor C1 and the second resistor R2, the switch signal SCRIO can be transmitted to the first switching transistor Q1. One end of the first resistor R1 receives the direct power VCC, and the other end of the first resistor R1 is coupled to the first terminal of the optical-controlled component 12 (i.e. the first end of the first optical-controlled thyristor U1). The first resistor R1 is a current limiting resistor.

In practice, the direct power VCC is from 10V to 20V. The switch signal SCRIO, which is a pulse signal (that may be at high level or low level), controls the optical-controlled component 12. The optical-controlled switch circuit 10 shown in FIG. 10 is a circuit that controls the SCR in an optical manner; however, how the switch circuit controls the SCR in the present disclosure is not restricted.

The SCR with optical-controlled driver 20 in FIG. 2 receives a utility power, and includes a second switching transistor Q2, a third switching element Q3, a first diode D1, a second diode D2, a third diode D3 and a fourth diode D4. The cathode of the second switching transistor Q2 is coupled to the first end of the main circuit 30 (the upper end of the main circuit 30 in FIG. 2), and the cathode of the third switching transistor Q3 is coupled to the anode of the second switching transistor Q2 and receives the utility power. The cathode of the first diode D1 is coupled to the gate of the second switching transistor Q2, and the anode of the first diode D1 is coupled to the third terminal of the optical-controlled component 12. The cathode of the second diode D2 is coupled to the gate of the third switching element Q3, and the anode of the second diode D2 is coupled to the anode of the first diode D1. The cathode of the third diode D3 is coupled to the anode of the second switching transistor Q3, which indicates that the third diode D3 receives the utility power, and the anode of the diode D3 is coupled to the fourth terminal of the optical-controlled component 12. The cathode of the fourth diode D4 is coupled to the anode of the third switching element Q3 and is coupled to the second end of the main circuit 30 (the lower end of the main circuit 30 in FIG. 2), and the anode of the fourth diode D4 is coupled to the anode of the third diode D3.

In one embodiment, the SCR with optical-controlled driver 20 further includes a second capacitor C2, a third capacitor C3, a seventh resistor R7 and an eighth resistor R8. The second capacitor C2 and the seventh resistor R7 are connected in parallel. A first end of the second capacitor C2 (i.e. the upper end of the second capacitor C2 shown in FIG. 2) is coupled to the cathode of the second switching element Q2, and a second end of the second capacitor C2 (i.e. the lower end of the second capacitor C2 shown in FIG. 2) is coupled to the gate of the second switching element Q2. The third capacitor C3 and the eighth resistor R8 are connected in parallel. A first end of the third capacitor C3 (i.e. the upper end of the third capacitor C3 shown in FIG. 2) is coupled to the cathode of the third switching element Q3, and a second end of the third capacitor C3 (i.e. the lower end of the third capacitor C3 shown in FIG. 2) is coupled to the gate of the third switching element Q3.

In other embodiments, the SCR with optical-controlled driver may include a third equalizing resistor R3, a fourth equalizing resistor R4, a fifth resistor R5 and a sixth resistor R6. A first end of the third equalizing resistor R3 (i.e. the upper end of the third equalizing resistor R3 shown in FIG. 2) is coupled to the third terminal of the optical-controlled component 12, and a second end of the third equalizing resistor R3 (i.e. the lower end of the third equalizing resistor R3 shown in FIG. 2) is coupled to a first end of the fourth equalizing resistor R4 and a fifth terminal of the optical-controlled component 12. The fifth terminal of the optical-controlled component 12 is a node between the fourth end of the first optical-controlled thyristor U1 and the third end of the second optical-controlled thyristor U2. A second end of the fourth equalizing resistor R4 (i.e. the lower end of the fourth equalizing resistor R4 shown in FIG. 2) is coupled to the fourth terminal of the optical-controlled component 12. A first end of the fifth resistor R5 (i.e. the left end of the fifth resistor R5 shown in FIG. 2) is coupled to the gate of the second switching transistor Q2, and a second end of the fifth resistor R5 (i.e. the right end of the fifth resistor R5 shown in FIG. 2) is coupled to the cathode of the first diode D1. A first end of the sixth resistor R6 (i.e. the left end of the sixth resistor R6 shown in FIG. 2) is coupled to the gate of the third switching element Q3, and a second end of the sixth resistor R6 (i.e. the right end of the sixth resistor R6 shown in FIG. 2) is coupled to the cathode of the second diode D2.

It should be noted that, in the above descriptions, the first diode D1, the second diode D2, the third diode D3 and the fourth diode D4 are rectifier diodes. The fifth resistor R5, the seventh resistor R7 and the second capacitor C2 are taken as a driving circuit of the second switching transistor Q2, and the sixth resistor R6, the eighth resistor R8 and the third capacitor R3 are taken as a driving circuit of the third switching element Q3. The optical-controlled component 12 can be implemented by one optical-controlled thyristor or by a plurality of optical-controlled thyristors connected in serial (e.g., the first optical-controlled thyristor U1 and the second optical-controlled thyristor U2), depending on the voltage value of the utility power. To equally divide the voltage drop caused by the optical-controlled component 12, the first optical-controlled thyristor U1 and the third equalizing resistor R3 are connected in parallel and the second optical-controlled thyristor Us and the fourth equalizing resistor R4 are connected in parallel. However, the way by which the voltage drop caused by the optical-controlled component 12 is equally divided is not restricted. Also, in other embodiments, the voltage drop caused by the optical-controlled component 12 can be divided unequally.

In FIG. 2, the main circuit 30 is coupled to the SCR with optical-controlled driver 20. The main circuit 30 has an A terminal (shown by "A" in FIG. 2), a B terminal (shown by "B" in FIG. 2) and a ground terminal. The A terminal of the main circuit 30 is coupled to the cathode of the second switching element Q2, and the B terminal of the main circuit 30 is coupled to the anode of the third switching element Q3. The main circuit 30 includes a first DC-DC converter 31 and a second DC-DC converter 32. A first end of the first DC-DC converter 31 is the A terminal of the main circuit 30, and a second end of the first DC-DC converter 31 is the ground terminal of the main circuit 30. A first end of the second DC-DC converter 32 is the B terminal of the main circuit 30, and a second end of the second DC-DC converter 32 is the ground terminal of the main circuit 30.

The first DC-DC converter 31 includes a first inductor L1, a fourth switching transistor Q4, a fifth diode D5, a fourth capacitor C4 and a sixth capacitor C6. A first end of the first inductor L1 (i.e. the left end of the first inductor L1 shown in FIG. 2) is coupled to the cathode of the second switching transistor Q2, and a second end of the first inductor L1 (i.e. the right end of the first inductor L1 shown in FIG. 2) is coupled to the drain of the fourth switching transistor Q4. The source of the fourth switching transistor Q4 is coupled to the ground terminal of the main circuit 30. The anode of the fifth diode D5 is coupled to the second the first inductor L1, and the cathode of the fifth diode D5 is coupled to a first end of the sixth capacitor C6 (i.e. the upper end of the sixth capacitor C6 shown in FIG. 2). A second end of the sixth capacitor C6 (i.e. the lower end of the sixth capacitor C6 shown in FIG. 2) is coupled to the ground terminal of the main circuit 30. A first end of the fourth capacitor C4 (i.e. the upper end of the fourth capacitor C4 shown in FIG. 2) is coupled to the first end of the first inductor L1, and a second end of the fourth capacitor C4 (i.e. the lower end of the fourth capacitor C4 shown in FIG. 2) is coupled to the ground terminal of the main circuit 30.

The second DC-DC converter 32 includes a second inductor L2, a fifth switching transistor Q5, a sixth diode D6, a fifth capacitor C5 and a seventh capacitor C7. A first end of the second inductor L2 (i.e. the left end of the second inductor L2 shown in FIG. 2) is coupled to the anode of the third switching element Q3. The drain of the fifth switching transistor Q5 is coupled to the ground terminal of the main circuit 30, and the source of the fifth switching transistor Q5 is coupled to a second end of the second inductor L2 (i.e. the right end of the second inductor L2 shown in FIG. 2). The cathode of the sixth diode D6 is coupled to the second end of the second inductor L2. A first end of the fifth capacitor C5 (i.e. the lower end of the fifth capacitor C5 shown in FIG. 2) is coupled to the first end of the second inductor L2, and a second end of the fifth capacitor C5 (i.e. the upper end of the fifth capacitor C5 shown in FIG. 2) is coupled to the ground terminal of the main circuit 30. A first end of the seventh capacitor C7 (i.e. the lower end of the seventh capacitor C7 shown in FIG. 2) is coupled to the anode of the sixth diode D6, and a second end of the seventh capacitor C7 (i.e. the upper end of the seventh capacitor C7 shown in FIG. 2) is coupled to the ground terminal of the main circuit 30.

In this embodiment, the main circuit 30 is implemented by a high frequency DC-DC converter using an SCR (Silicon Controlled Rectifier; SCR). However, it is not limited thereto.

Figure 3:
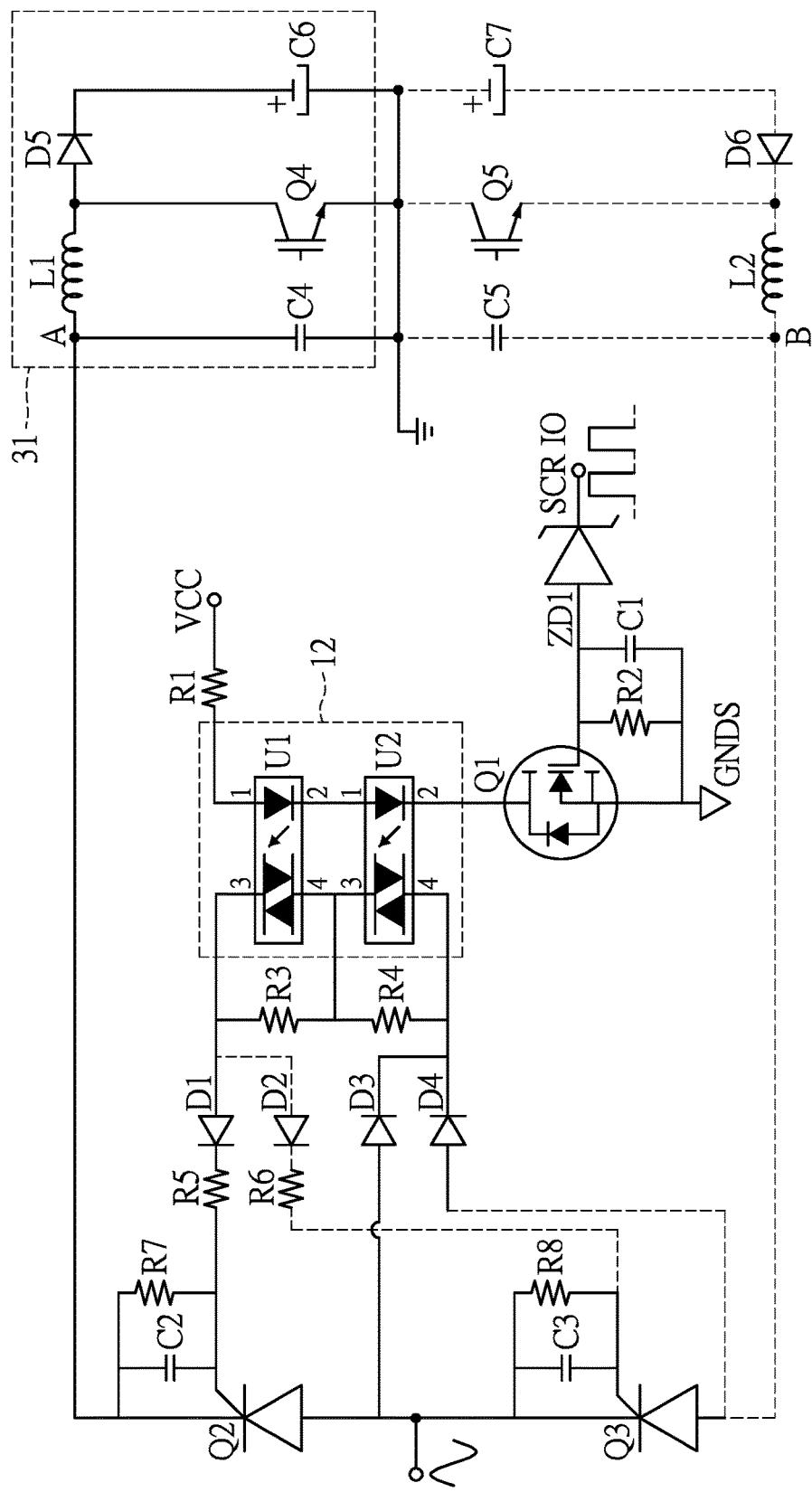
FIG. 3 is a circuit diagram showing the optical-controlled driving circuit in FIG. 2 works under a positive half cycle of the utility power.
Figure 4:
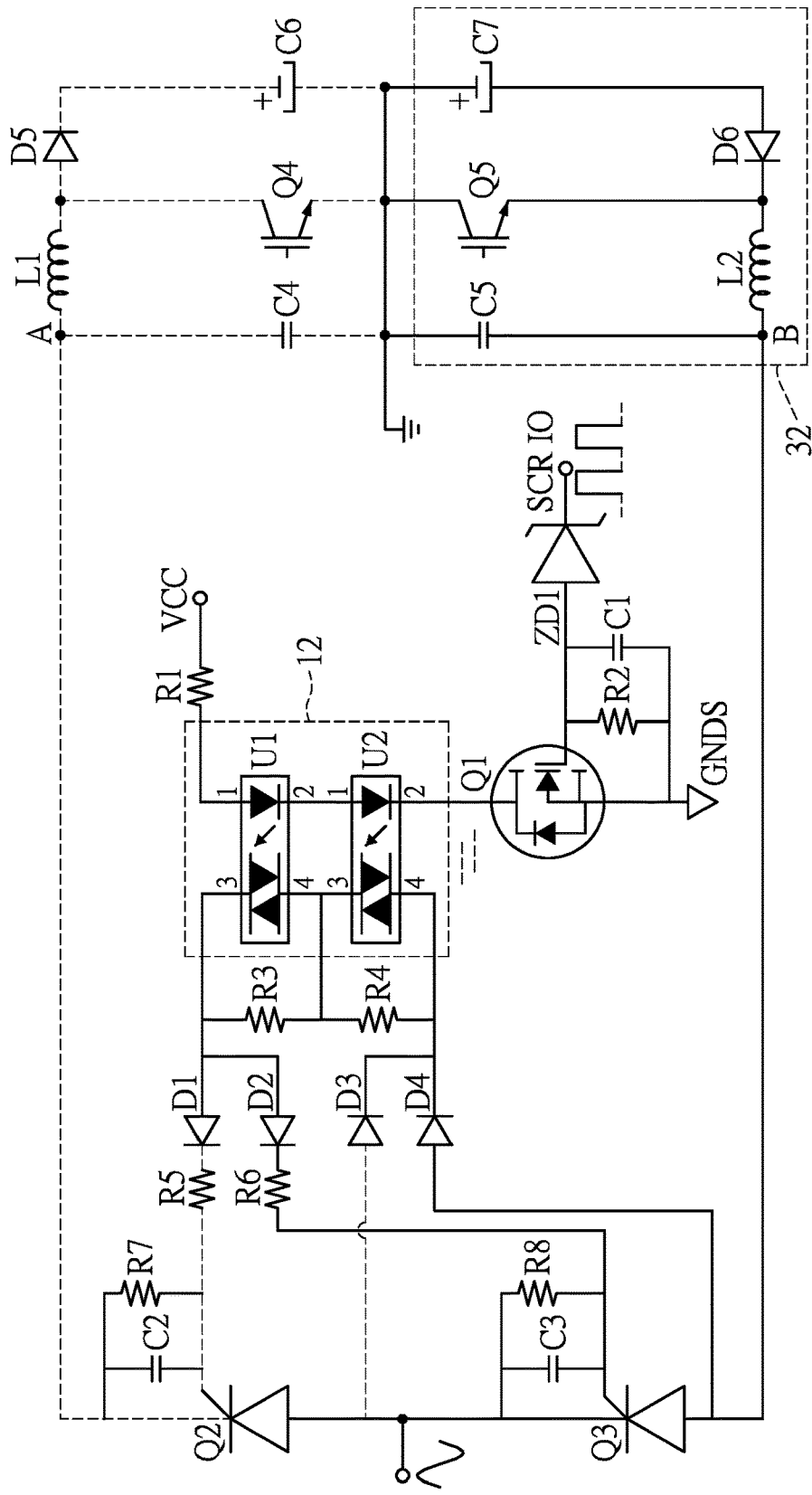
FIG. 4 is a circuit diagram showing the optical-controlled driving circuit in FIG. 2 works under a negative half cycle of the utility power.

FIG. 3 is a circuit diagram showing the optical-controlled driving circuit in FIG. 2 working under a positive half cycle of the utility power, and FIG. 4 is a circuit diagram showing the optical-controlled driving circuit in FIG. 2 working under a negative half cycle of the utility power. As shown in FIG. 3, when the optical-controlled driving circuit works under a positive half cycle of the utility power, the current provided by the utility power flows through the third diode D3, the second optical-controlled thyristor U2, the first optical-controlled thyristor U1, the first diode D1, the fifth resistor R5, the seventh resistor R7 and finally to the first DC-DC converter 31 of the main circuit 30. When the switch signal SCRIO is at high level, the resistances of the first optical-controlled thyristor U1 and the second optical-controlled thyristor U2 drop from a high resistance value to zero. As a result, the voltage drop of the seventh resistor R7 increases so that the second switching transistor Q2 is turned on and the voltage drop between the anode and the cathode of the second switching transistor Q2 decreases to a normal turn-on voltage. The voltage drop of the seventh resistor R7 maintains at a steady driving voltage of the SCR. The driving current of the SCR is provided by the utility power, which is a continual power, so that the damage rate of the SCR will be low when the SCR is in the on state.

As shown in FIG. 4, when the optical-controlled driving circuit works under a negative half cycle of the utility power, the current provided by the utility power flows through the fourth diode D4, the second optical-controlled thyristor U2, the first optical-controlled thyristorU1, the second diode D2, the eighth resistor R8, and finally to the second DC-DC converter 32. When the switch signal SCRIO is at high level, the resistances of the first optical-controlled thyristor U1 and the second optical-controlled thyristor U2 drop from a high resistance value to zero. As a result, the voltage drop of the eighth resistor R8 increases so that the third switching transistor Q3 is turned on and the voltage drop between the anode and the cathode of the third switching transistor Q3 decreases to a normal turn-on voltage. The voltage drop of the eighth resistor R8 maintains at a steady driving voltage of the SCR. The driving current of the SCR is provided by the utility power, which is a continual power, so that the damage rate of the SCR will be low when the SCR is in the on state.

In the present disclosure, the turn-on resistance of the SCR is continuous by virtue of the SCR with optical-controlled driver, so that when the SCR works under a light load, the SCR being in the on state can have a lower damage rate and a better operation efficiency.

According to the above embodiments, the present disclosure provides an optical-controlled driving circuit that can adjust the driving current according to the voltage of the utility power. Furthermore, the optical-controlled driving circuit can work under a high utility power environment with high voltages, large currents and severe surges, and thus has better operation efficiency. The circuit structure of the optical-controlled driving circuit is reliable, and can be used in a DC converter using the SCR as a switch element for increasing the operation efficiency when the DC converter works under a light load.

Therefore, the optical-controlled driving circuit provided by the present disclosure improves on the conventional SCR driving circuit. The optical-controlled driving circuit provided by the present disclosure can work under a high utility power environment with high voltages, large currents and severe surges and helps to increase the operation efficiency of a DC converter.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. An optical-controlled driving circuit, working under a high utility power environment with high voltages, large currents and surges, comprising:
    an optical-controlled switch circuit, including an optical-controlled component and a first switching transistor, and receiving a switch signal, wherein the optical-controlled component and the first switching transistor are connected in serial, and the optical-controlled component has at least four terminals;
    an SCR with optical-controlled driver, receiving a utility power, coupled to the optical-controlled switch circuit, including:
        a second switching element;
        a third switching element, wherein a cathode of the third switching element is coupled to an anode of the second switching element and receives the utility power;
        a first diode, wherein a cathode of the first diode is coupled to a gate of the second switching element, and an anode of the first diode is coupled to a third terminal of the optical-controlled component;
        a second diode, wherein a cathode of the second diode is coupled to a gate of the third switching element, and an anode of the second diode is coupled to the anode of the first diode;
        a third diode, wherein a cathode of the third diode is coupled to the anode of the second switching element, and an anode of the third diode is coupled to a fourth terminal of the optical-controlled component; and
        a fourth diode, wherein a cathode of the fourth diode is coupled to an anode of the third switching element, and an anode of the fourth diode is coupled to the anode of the third diode; and
    a main circuit, coupled to the SCR with optical-controlled driver, and having an A terminal, a B terminal and a ground terminal, wherein the A terminal of the main circuit is coupled to the cathode of the second switching element, and the B terminal is coupled to the anode of the third switching element;
    wherein the SCR with optical-controlled driver further includes:
    a third equalizing resistor and a fourth equalizing resistor, wherein a first end of the third equalizing resistor is coupled to the third terminal of the optical-controlled component, a second end of the third equalizing resistor is coupled to a first end of the fourth equalizing resistor and a fifth terminal of the optical-controlled component, and a second end of the fourth equalizing resistor is coupled to the fourth terminal of the optical-controlled component.

2. The optical-controlled driving circuit according to claim 1, wherein the SCR with optical-controlled driver further includes:
    a second capacitor and a seventh resistor, wherein the second capacitor and the seventh resistor are connected in parallel, a first end of the second capacitor is coupled to the cathode of the second switching element, and a second end of the second capacitor is coupled to the gate of the second switching element; and
    a third capacitor and an eighth resistor, wherein the third capacitor and the eighth resistor are connected in parallel, a first end of the third capacitor is coupled to the cathode of the third switching element, and a second end of the third capacitor is coupled to the gate of the third switching element.

3. The optical-controlled driving circuit according to claim 1, wherein the SCR with optical-controlled driver further includes:
    a fifth resistor and a sixth resistor, wherein a first end of the fifth resistor is coupled to the gate of the second switching element, a second end of the fifth resistor is coupled to the cathode of the first diode, a first end of the sixth resistor is coupled to the gate of the third switching element, and a second end of the sixth resistor is coupled to the cathode of the second diode.

4. The optical-controlled driving circuit according to claim 1, wherein the optical-controlled component has two optical-controlled thyristors connected in serial, a first terminal of the optical-controlled component receives a direct power, a drain of the first switching transistor is coupled to a second terminal of the optical-controlled component, a source of the first switching transistor is grounded and connected to a ground wire of the direct power, and a gate of the first switching transistor receives the switch signal.

5. The optical-controlled driving circuit according to claim 4, wherein optical-controlled component includes:

a first optical-controlled thyristor, wherein a first end of the first optical-controlled thyristor receives the direct power, and a third end of the first optical-controlled thyristor is coupled to the anode of the first diode; and a second optical-controlled thyristor, wherein a first end of the second optical-controlled thyristor is coupled to a second end of the first optical-controlled thyristor, a second end of the second optical-controlled thyristor is coupled to the drain of the first switching transistor, a third end of the second optical-controlled thyristor is coupled to a fourth end of the first optical-controlled thyristor, and a fourth end of the second optical-controlled thyristor is coupled to the anode of the fourth diode.

6. The optical-controlled driving circuit according to claim 4, wherein the optical-controlled switch circuit further includes a voltage regulating element and a first resistor, the a cathode of the voltage regulating element receives the switch signal, an anode of the voltage regulating element is coupled to the gate of the first switching transistor, and the first resistor is coupled between the direct power and the first terminal of the optical-controlled component.

7. The optical-controlled driving circuit according to claim 6, wherein the optical-controlled switch circuit further includes a first capacitor and a second a second resistor, the first capacitor and the second resistor are connected in parallel, a first end of the first capacitor is coupled to the gate of the first switching transistor, and a second end of the first capacitor is coupled to the source of the first switching transistor.

* * * * *